US005327505A

United States Patent [19]

Kim

[11] Patent Number: 5,327,505

[45] Date of Patent: Jul. 5, 1994

[54] MULTIPLE OUTPUT TRANSFORMERS NETWORK FOR SOUND REPRODUCING SYSTEM

[76] Inventor: Man Ho Kim, AL. DOS Tupiniquins 285, S'ao Paulo, Brazil, 04 077

[21] Appl. No.: 825,054

[22] Filed: Jan. 24, 1992

[51] Int. Cl.[5] .......... H03G 5/00

[52] U.S. Cl. .......... 381/99; 381/77; 381/120

[58] Field of Search .......... 381/77, 78, 99, 120; 330/195, 196

[56] References Cited

U.S. PATENT DOCUMENTS

| | | | |
|---|---|---|---|
| 1,632,104 | 6/1927 | Whiting | 330/196 |
| 1,711,529 | 5/1929 | Hahnemann | 381/99 |
| 1,907,723 | 5/1933 | Bostwick | 381/99 |
| 2,054,647 | 9/1936 | Ballantine | 381/99 |
| 2,469,986 | 5/1949 | Phyfe | 381/78 |
| 3,192,490 | 6/1965 | Petts, III et al. | 333/11 |
| 3,348,160 | 10/1967 | Lee et al. | 330/15 |
| 3,931,469 | 1/1976 | Elliott et al. | 381/99 |

OTHER PUBLICATIONS

Langford-Smith, Radiotron Designer's Handbook, 1968, pp. 882-889.

*Primary Examiner*—Forester W. Isen
*Attorney, Agent, or Firm*—Keith D. Beecher

[57] ABSTRACT

A multiple output transformer network for a high-fidelity sound reproducing system which includes a high-frequency speaker and a low-frequency speaker, first and second output transformers, a high frequency by-pass filter coupling the secondary of the first output transformer to the high frequency speaker, and a low-frequency by-pass filter coupling the secondary of the second transformer to the second speaker, all mounted in a remote speaker unit. The by-pass filters have predetermined crossover characteristics. The primary windings of the transformers are connected to the output amplifier of the sound reproducing equipment by first and second extension leads.

3 Claims, 5 Drawing Sheets

AUDIO INPUT
AUDIO POWER AMPLIFIER 10
10
16
18
B+
12
13
14
15
20
HIGH FREQUENCY SPEAKER
LOW FREQUENCY SPEAKER
30
32
36
38
22
24
REMOTE SPEAKER UNIT 20

108
16
18
TO REMOTE SPEAKER UNIT 20
B+
AUDIO INPUT 10A
16
18
TO REMOTE SPEAKER UNIT 20
B+
AUDIO AMPLIFIER IN PENTODE TUBES ONLY
AUDIO INPUT

DETAIL SPECIFICATION FOR HIGH FREQUENCY NETWORK 36A

DETAIL SPECIFICATION FOR LOW FREQUENCY NETWORK 38A

MULTIPLE OUTPUT TRANSFORMERS NETWORK FOR SOUND REPRODUCING SYSTEM

BACKGROUND OF THE INVENTION

The invention relates to high-fidelity sound reproducing systems and more particularly to such systems in which the output transformers are located in the speaker unit at a position remote from the main amplifier of the sound reproducing unit.

It is usual in high-fidelity sound reproducing systems, to use two or more speakers which cover complementary frequency ranges. Specifically, in two-speaker system, a high-frequency speaker (tweeter or driver) and a low-frequency speaker (woofer) are provided with appropriate high-frequency and low-frequency bypass filters with predetermined crossover characteristics so that audio output signals in the high frequency portion of the frequency range may be directed predominantly to the high-frequency speaker and signals in the mid and low-frequency portion of the frequency range may be directed predominantly to the low-frequency speaker.

In such a system, the output from the output audio power amplifier of the sound reproducing equipment is supplied to a passive cross-over network which separates the high and low frequencies, thereby supplying the mid and low frequencies to the woofer and the high frequencies to the tweeter or driver.

To achieve realism in sound reproduction systems fundamental conditions must be satisfied, namely, the frequency range must include without frequency discrimination all audible components of the various sounds to be reproduced; the volume range must permit noiseless and distortionless reproduction of the entire range of intensity associated with the sounds; and the reverberation characteristics of the original sound must be approximated in the reproduced sound.

It has been found difficult in the prior art sound reproducing systems to fulfil some of the fundamental conditions listed above without resorting to relatively complex and expensive circuitry, especially in cases where the speakers are located at a position remote from the output power amplifier of the sound reproducing equipment.

Such difficulties are overcome in the system of the present invention by locating the output transformers and the high-frequency/low-frequency bypass-filters in the remote speaker unit, and then by coupling primary windings of the output transformers to the power amplifier of the sound reproducing equipment by appropriate extension leads.

In the system of the invention there are no appreciable energy losses or changes in frequency characteristics due to the extension leads, which occur in the prior art systems. The system of the invention also assures the complete separation of high and low frequency signals from the output amplifier. This is because the separated signals are delivered directly to the speakers.

The system of the invention also provides for the availability of completely independent volume controls for each speaker and assures distinct crossover characteristics for high and low-frequency components, and also for mid-frequency components if so desired.

For example, by overlapping frequencies independently, such as 20 Hz to 5,000 Hz for the low frequency speaker, and 150 Hz to 20,000 Hz for the high frequency speaker, faithful reproduction may be achieved, for solo performances of piano, violin and cello, for example, as well as for tenor and soprano singers.

Also, the system of the invention precludes distortions in the mid-frequency range when the low frequency filter is set, for example, to a range of 500 Hz to 4,000 Hz, with independent high-frequency separation for choruses, symphony orchestras, heavy metal music, etc. Specifically, the system of the invention permits the control of crossover, and independent control of volume in each frequency range so as to adapt the reproduction characteristics of the system to the sounds being reproduced.

In addition, overall efficiency is increased materially by the system of the present invention because separation of the frequency ranges occurs at the remote speaker unit rather than at the output amplifier. The overall result is that sound is reproduced by the speakers at a selected decibel level with less energy being required as compared with present day systems.

Moreover, damage to the speakers, such as burn out, is obviated in the system of the invention because the output signal from the output transformers is delivered directly to the voice coil of the speakers.

DETAILED DESCRIPTION OF THE ILLUSTRATED EMBODIMENTS

Figure 1:
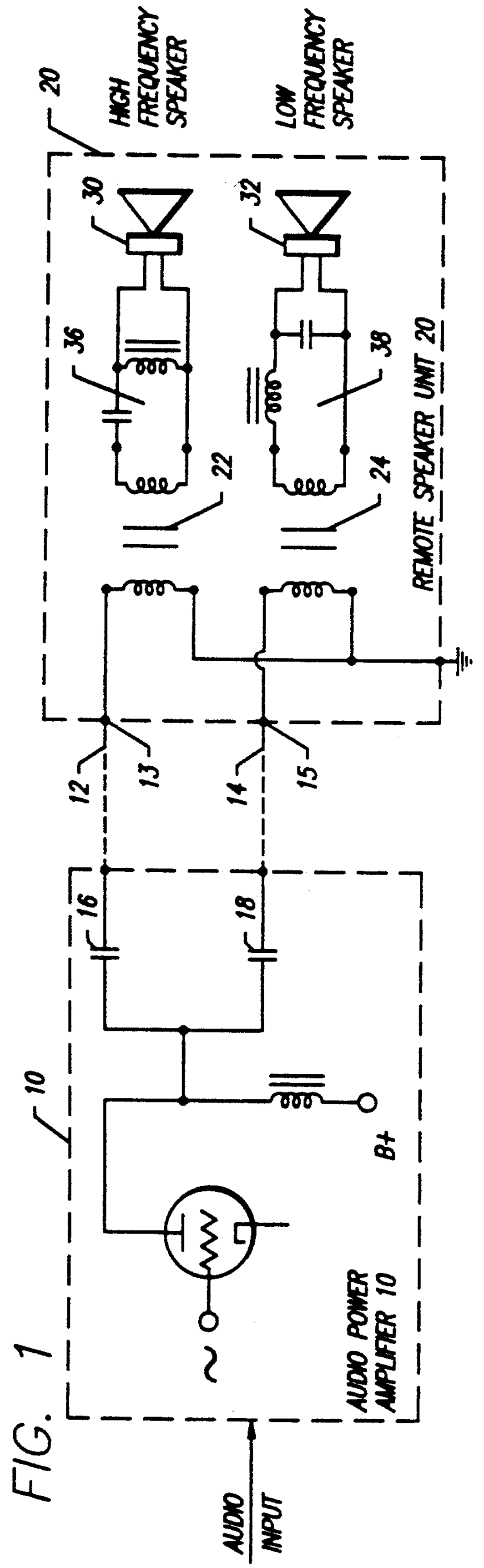
FIG. 1 is a schematic diagram, partly in circuit detail, illustrating the output audio power amplifier of a particular sound reproducing unit connected to a remote speaker unit which includes output transformers connected in a multiple output network representing one embodiment of the invention.

In the system of FIG. 1, the output audio power amplifier of a typical sound reproducing unit is designated 10. The output of the power amplifier is coupled to a pair of extension leads 12 and 14 by means of respective capacitors 16 and 18. The extension leads 12 and 14 are connected to the input terminals 13 and 15 of a remote speaker unit 20. The input terminals 13 and 15 are connected respectively to the primary windings of a pair of output transformers 22 and 24, the other terminals of the primary windings being grounded.

In the system of FIG. 1, the output transformers 22 and 24, instead of being incorporated into audio power output amplifier 10 in the sound reproducing unit, are located in the remote speaker unit 20. The secondary windings of the output transformers 22 and 24 are coupled respectively to a high-frequency speaker (tweeter or driver) 30 and a low-frequency speaker (woofer) 32 through a high pass filter network 36 and low-pass filter network 38, as shown.

In the system of FIG. 1, the extension leads 12 and 14 serve to couple the remote speaker unit 20 to the power amplifier 10 without any significant energy losses or changes in frequency characteristics which are inherent in the prior art systems in which the output transformers are located in the power amplifier of the sound reproducing equipment, as are the high-pass and low-pass filter networks 36 and 38. Accordingly, the cables connecting the sound reproducing equipment to the remote speakers in the prior art systems inherently exhibit energy losses and changes in frequency characteristics.

The system of FIG. 1 also assures complete separation of the high and low frequency signals from the output amplifier as the separated signals are delivered directly to the speakers.

Figure 3:
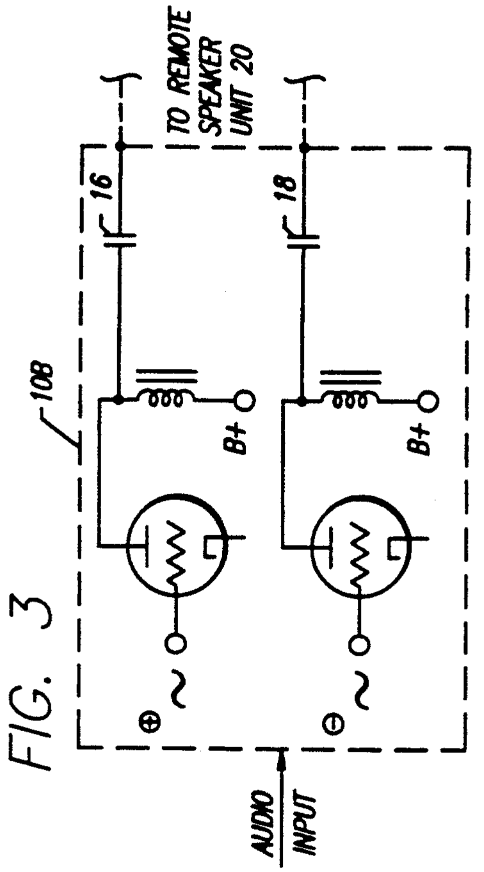
FIGS. 2 and 3 are further schematic representations showing inpartial circuit detail different types of power audio amplifiers of a sound reproducing units which may be connected to the remote speaker unit shown in FIG. 1.
Figure 2:
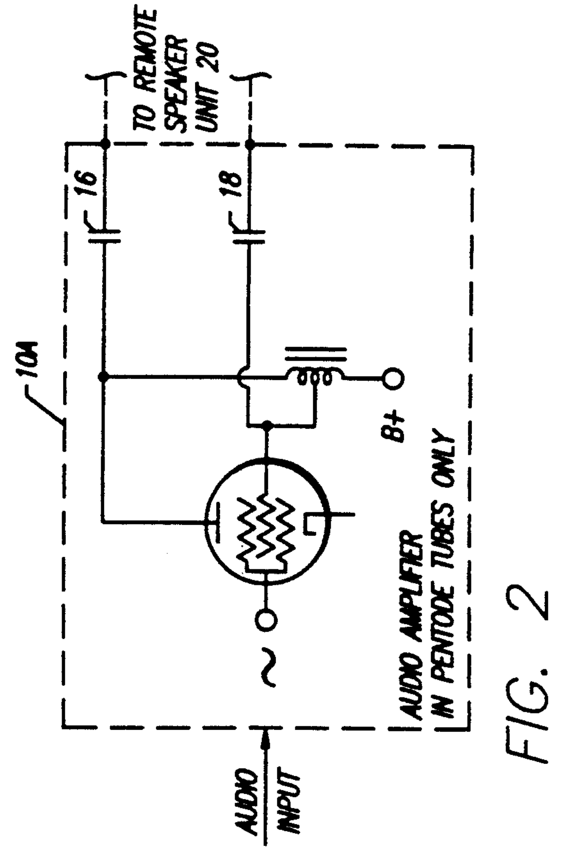

The power amplifier 10A of FIG. 2 is different from the power amplifier 10 of FIG. 1 in that it incorporates a pentode tube, the power amplifier 10A of FIG. 3 is different from the power amplifier 10 of FIG. 1 in that it incorporate a pair of electron discharge devices connected in the illustrated manner.

Figure 4:
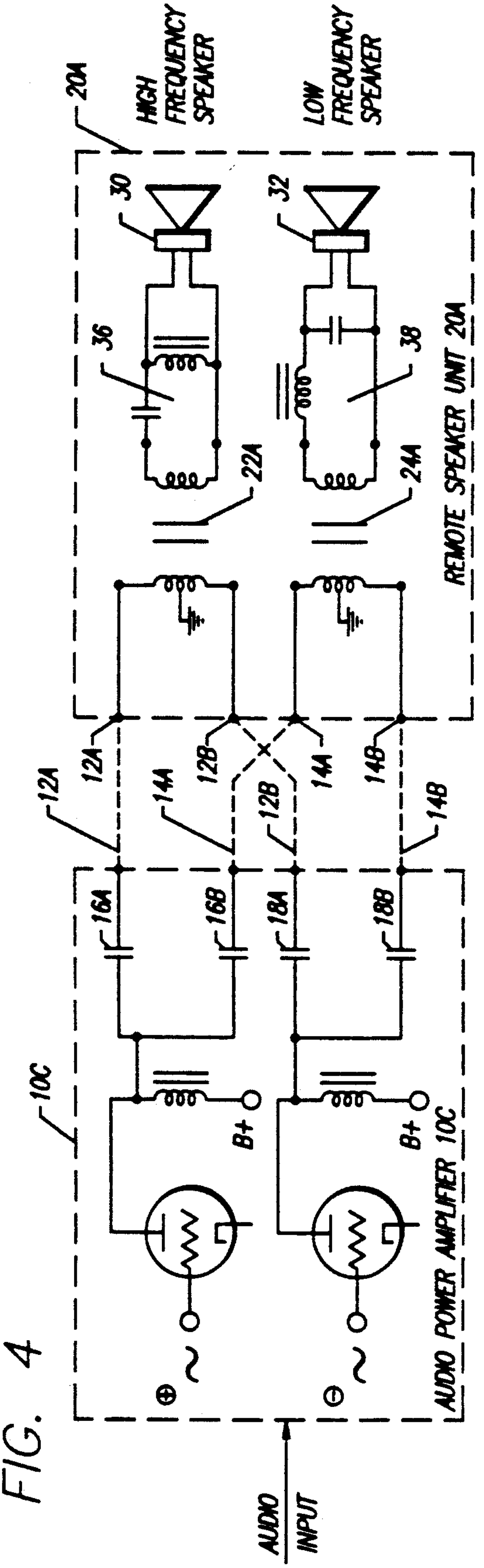
FIG. 4 is a schematic diagram, partially in circuit detail, of a second embodiment of the system of the invention.

The system of FIG. 4 includes a power amplifier 10C with push-pull output stages coupled to extension leads 12A, 12B and 14A, 14B through the capacitors 16A, 18A and 16B, 18B. The remote speaker unit 20A of the system of FIG. 4 includes output transformers 22A and 24A. The extension leads 12A, 14A, 12B and 14B are connected to the respective primary windings of the output transformers, as shown, and the secondary windings of the output transformers are interconnected as shown and coupled through the high frequency and low frequency filters 36 and 38 to the speakers 30 and 32.

Figure 5:
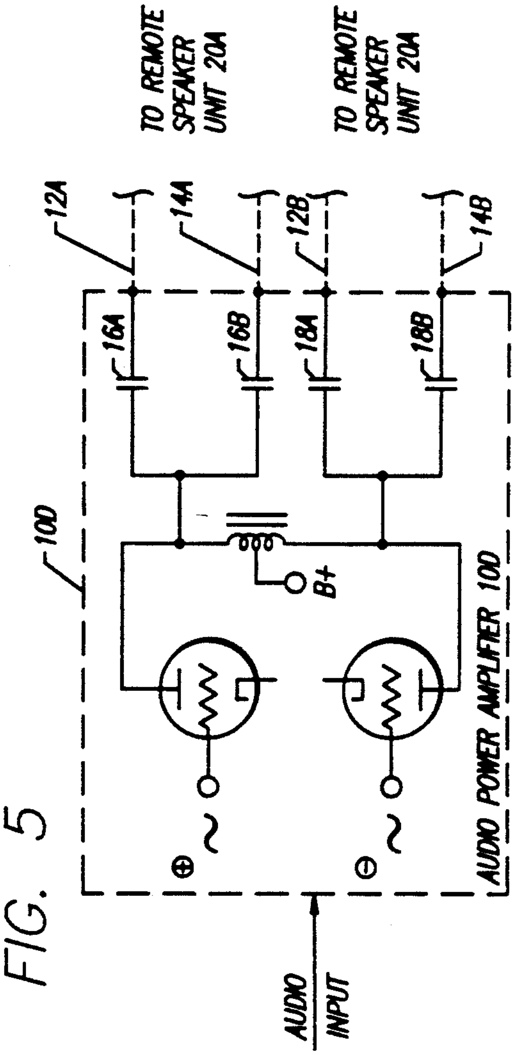
FIGS. 5, 6 and 7 are schematic diagrams, partially in circuit detail of additional embodiments of the invention.
Figure 6:
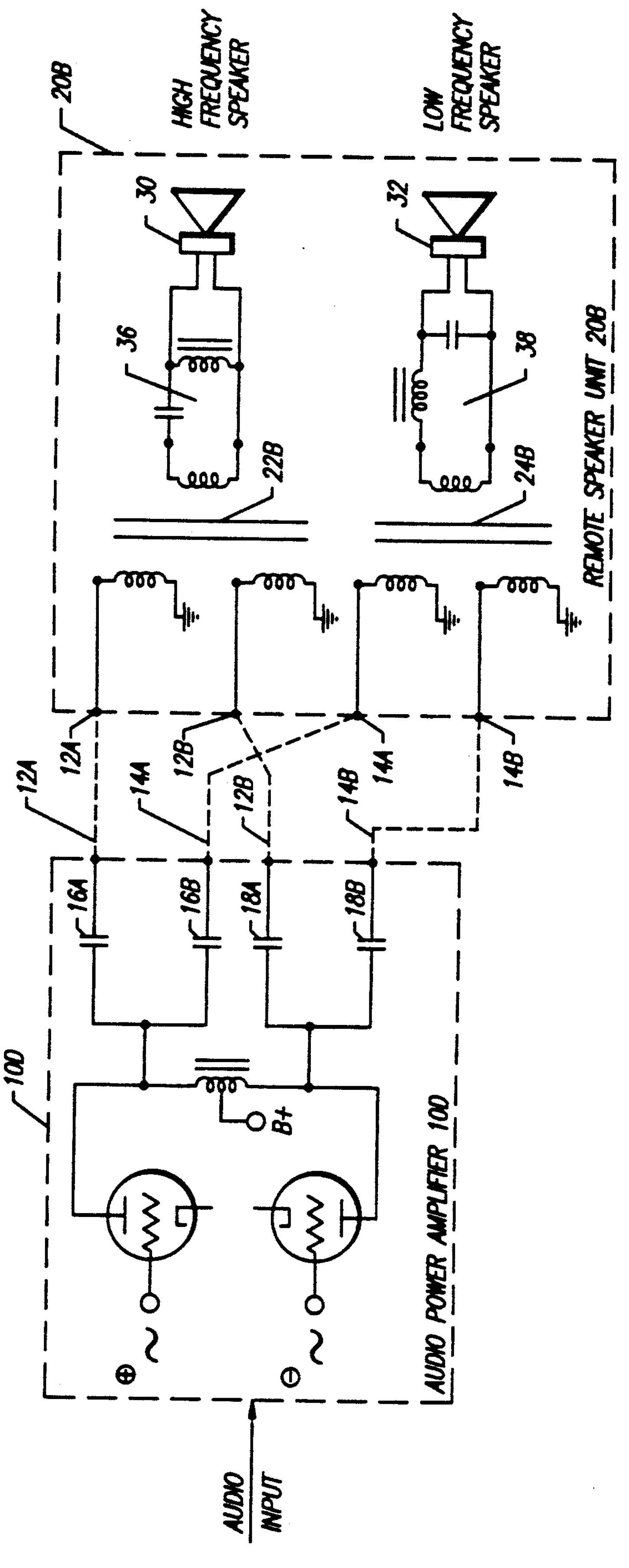

Further embodiments of the invention are shown in FIGS. 5 and 6. The power amplifier 10D of FIGS. 5 and 6 includes push-pull output stages like the amplifier 10C of FIG. 4, connected as shown to the extension leads 12A, 12B 14A and 14B. The extension leads in FIG. 5 are connected to the remote unit 20A of FIG. 4. The extension leads 12A, 12B, 14A 14B and FIG. 6 are connected to a modified remote speaker unit 20B which includes transformers 22B, 24B connected as shown.

Figure 7:
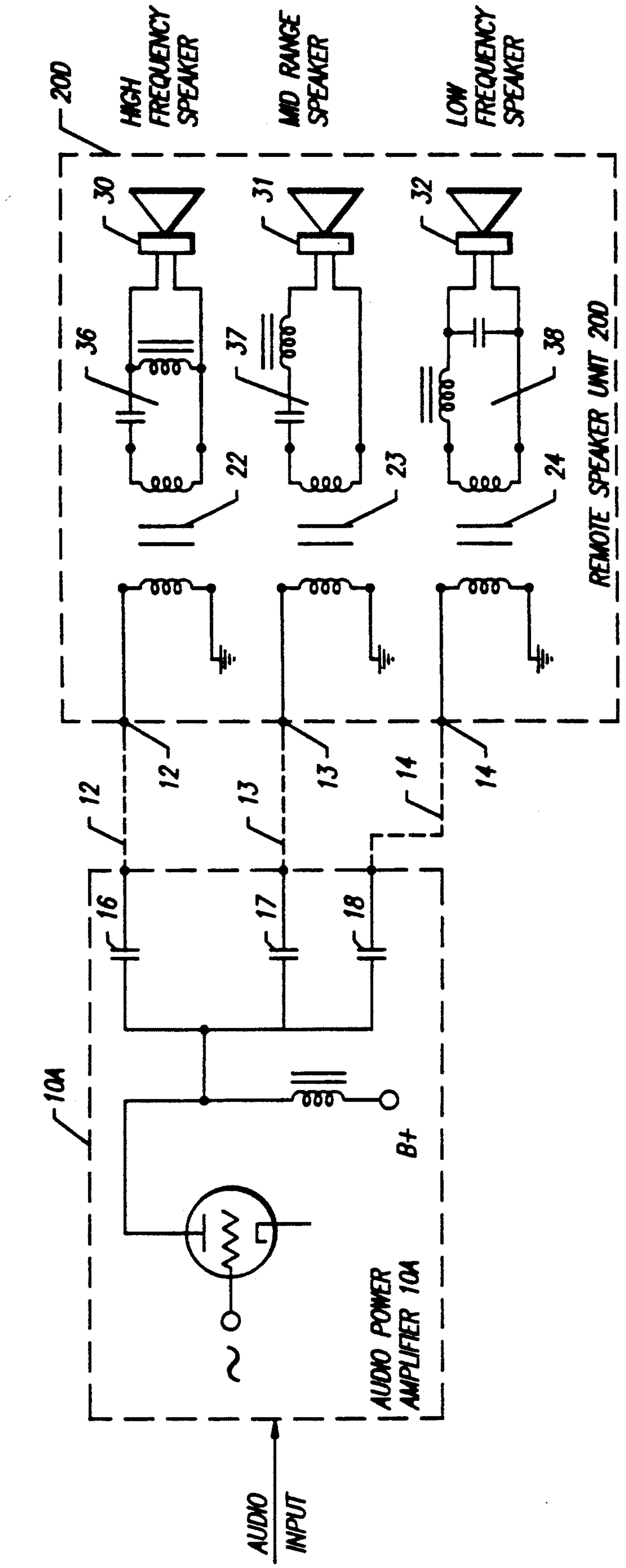

The circuit of FIG. 7 is similar to that of FIG. 1, except that it includes a mid range speaker 31, an additional capacitor 17, an additional extension lead 13, an additional transformer 23, and a mid range by-pass filter 37. The circuits of FIGS. 2-7 may also be modified to incorporate mid range speakers. Additional range speakers may also be incorporated.

The circuits of FIGS. 1, 2, 3, 4, 5, 6 and 7 merely show different configurations for practicing the invention, and all are predicted on the concept of locating the output transformers and the low pass and high pass filters in a remote speaker unit so that inexpensive extension leads may be used to connect the power amplifier of the sound reproducing unit to the speakers with low loss characteristics.

Figure 8:
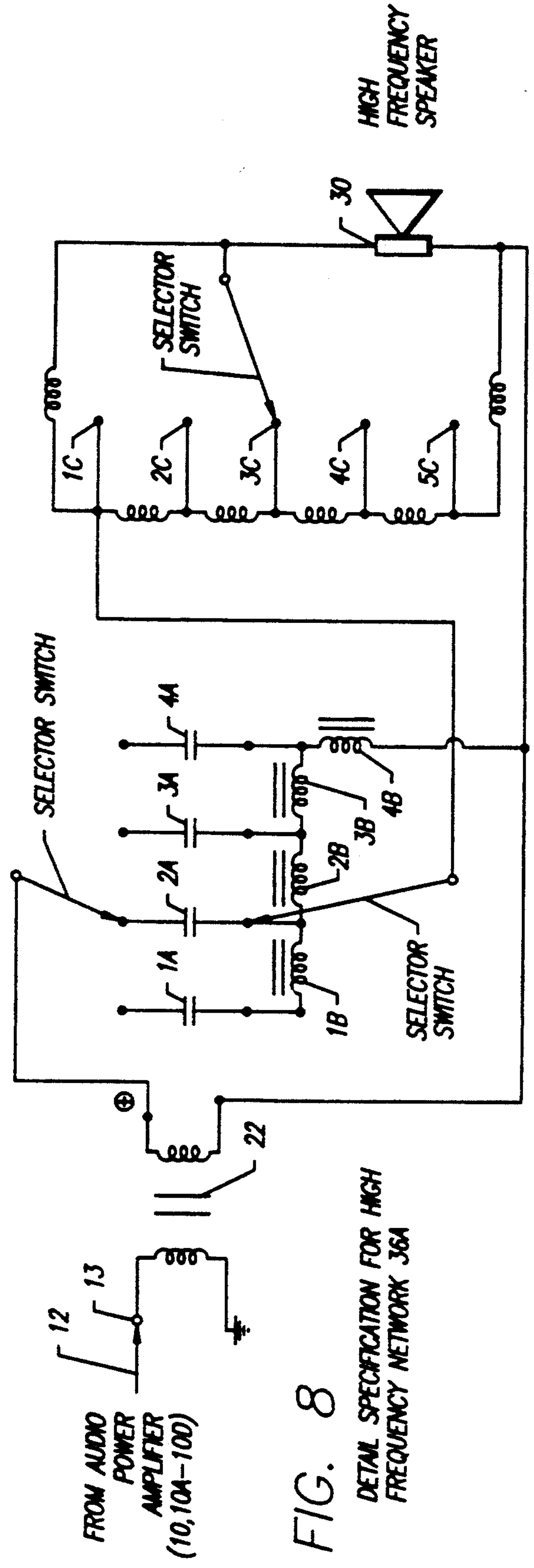
FIGS. 8 and 9 are circuit diagram respectfully of a high frequency network and a low frequency network located in the remote speaker unit and which provide adjustable cross-over characteristics for the speaker unit.
Figure 9:
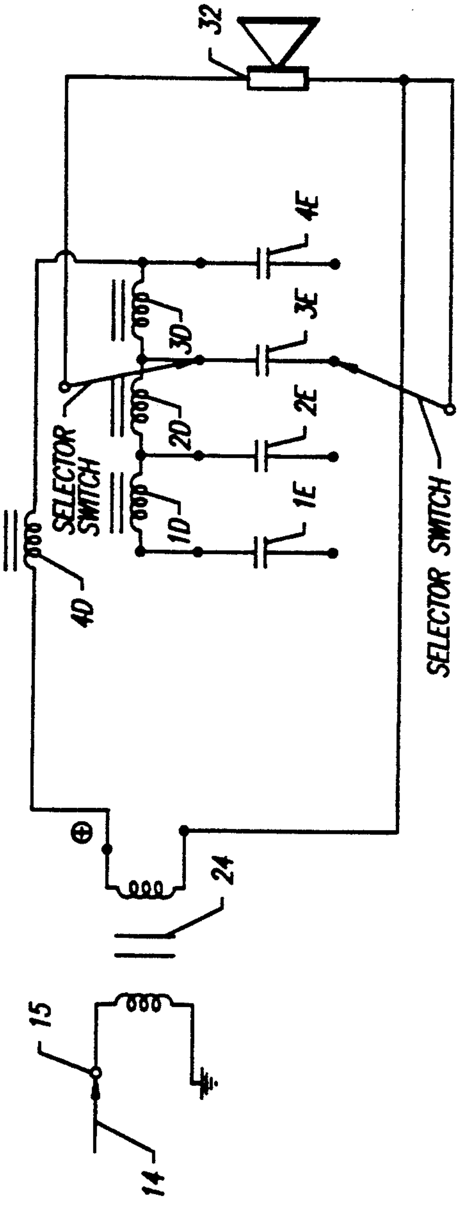

The adjustable high frequency filter network 36A of FIG. 8, and the adjustable low frequency filter network 38A of FIG. 9 may be included in all the remote speaker units. In the circuit of FIG. 8, the high-frequency filter 36A is made up of a plurality of a capacitors 1A-4A of different values, and a plurality of inductance coils 1B-4B, likewise of different values. The capacitors and inductance coils are selectively connected into the circuit by the selective actuation of the illustrated switches, which may be components of a manually operated slide switch. In this manner, the operator may select any desired characteristics for the high frequency filter 36A, depending upon the sounds to be reproduced by the high frequency speaker 30.

Likewise, in FIG. 9 the low frequency by-pass filter network 38A coupling the secondary of transformer 24 to the low frequency speaker 32 is made up of a series of inductance coils **1*d*-4*d*, and a series of capacitors 1*e*-4*e*** which may be selectively connected into the circuit by operation of the illustrated switches, which, likewise, may be components of a slide switch.

Accordingly, in the circuits of FIGS. 8 and 9, the operator may adjust the characteristics of the high pass filter 36A and of the low pass filter 38A to the particular sounds to be reproduced.

It will be appreciated that while particular embodiments of the invention have been shown and described, modifications may be made. It is intended in the Claims to cover all modification which come within the true spirit and scope of the invention.

I claim:

1. In combination: sound reproducing equipment including an output power amplifier; a remote speaker unit; a plurality of extension leads extending between said power amplifier and said remote speaker unit; a corresponding plurality of capacitors included in said power amplifier for coupling said extension leads to said power amplifier; a high frequency speaker and a low frequency speaker included in said remote speaker unit; a corresponding plurality of output transformers included in said remote speaker unit each having a primary winding and a secondary winding and having respective ones of the primary windings connected to corresponding ones of said extension leads; a high frequency filter included in said remote speaker unit coupling the secondary of one of said output transformers to said high frequency speaker; a low frequency filter included in said speaker unit coupling the secondary winding of another of said output transformers to said low frequency speaker; said high frequency filter and said low frequency filter having predetermined crossover characteristics, said high frequency filter and said low frequency filter each including inductance means and capacitance means; first control means coupled to said high frequency filter for varying the inductance of said inductance means and the capacitance of said capacitance means included in said high frequency filter; and second control means coupled to said low frequency filter for varying the inductance of said inductance means and the capacitance of said capacitance means included in said low frequency filter.

2. The combination defined in claim 1, and which includes four extension leads extending between said power amplifier and said speaker unit; four capacitors included in said power amplifier respectively coupling said four extension leads to said power amplifier; and two output transformers included in said remote speaker unit each having a primary winding connected to a corresponding two of said extension leads, and each of said primary windings having a grounded center tap.

3. The combination defined in claim 1, and which also includes a mid-range speaker included in said remote speaker unit; and which also includes three extension leads extending between said power amplifier and said speaker unit; three capacitors included in said power amplifier respectively coupling said three extension leads to said power amplifier; and three output transformers included in said remote speaker unit each having a primary winding connected to a corresponding one of said three extension leads; and a mid-range band pass filter coupling the secondary winding of one of said output transformers to said mid-range speaker.

* * * * *